United States Patent [19]

Bertone

[11] Patent Number: 5,380,367
[45] Date of Patent: Jan. 10, 1995

[54] VAPOUR GENERATOR FOR CHEMICAL VAPOUR DEPOSITION SYSTEMS

[75] Inventor: Daniele Bertone, Torino, Italy

[73] Assignee: Cselt - Centro Studi E Laboratori Telecomunicazioni S.p.A., Torino, Italy

[21] Appl. No.: 139,395

[22] Filed: Oct. 18, 1993

[30] Foreign Application Priority Data

Dec. 4, 1992 [IT] Italy ............... 92A 000981

[51] Int. Cl.⁶ ............................................. C23C 16/00
[52] U.S. Cl. ........................ 118/726; 222/630; 261/16
[58] Field of Search ........... 222/630; 261/16, 19.1; 118/715, 726

[56] References Cited

U.S. PATENT DOCUMENTS

| | | | |
|---|---|---|---|
| 4,506,815 | 3/1985 | Melas et al. | 222/630 |
| 4,545,801 | 10/1985 | Miyajiri et al. | 118/715 |
| 4,783,343 | 11/1988 | Sato | 118/726 |
| 4,919,304 | 4/1990 | Markowicz | 222/630 |
| 5,069,244 | 12/1991 | Miyazaki et al. | 137/209 |
| 5,151,395 | 9/1992 | Tom | 502/67 |
| 5,199,603 | 4/1993 | Prescott | 222/630 |

Primary Examiner—Olik Chaudhuri
Assistant Examiner—Brian K. Dutton
Attorney, Agent, or Firm—Herbert Dubno

[57] ABSTRACT

The vapour generator for chemical vapour deposition plants allows the extraction of metalorganic vapours from liquid or solid sources. It mainly consists of a container into which a gas flows in, and as it passes near the reagent, it is saturated with the vapours produced and transports them to the reaction chamber. Only the generator is brought to a temperature which is higher than room temperature so as to obtain a vapour which is saturated with a high quantity of reagent. To avoid vapour condensation in the pipe system transporting it from the generator to the reaction chamber, it is diluted with a carrier gas directly in the body of the heated generator, reducing in this way the condensation temperature of vapour which becomes unsaturated. For this purpose, the generator contains a dilution bypass-line in the upper base into which the carrier gas is made to flow. The pipe system going from the generator to the reaction chamber can be held at room temperature without any condensation risks.

3 Claims, 1 Drawing Sheet

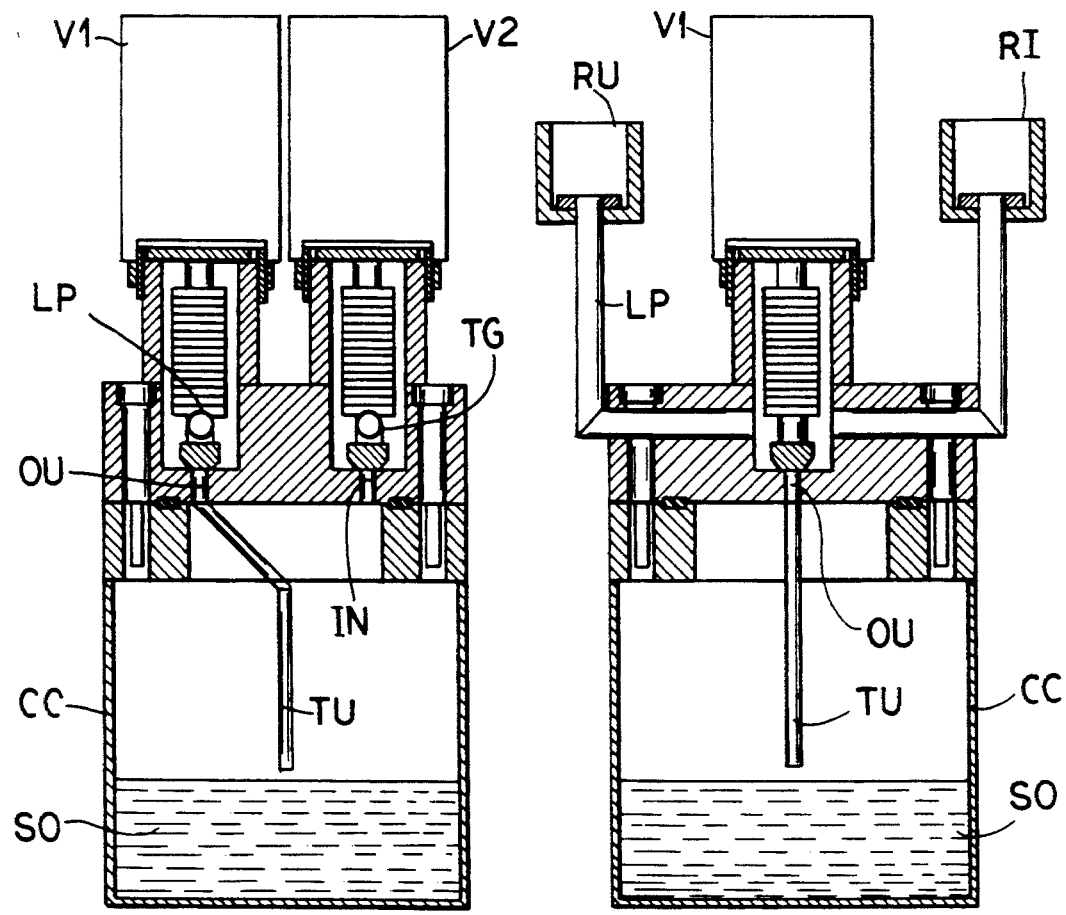
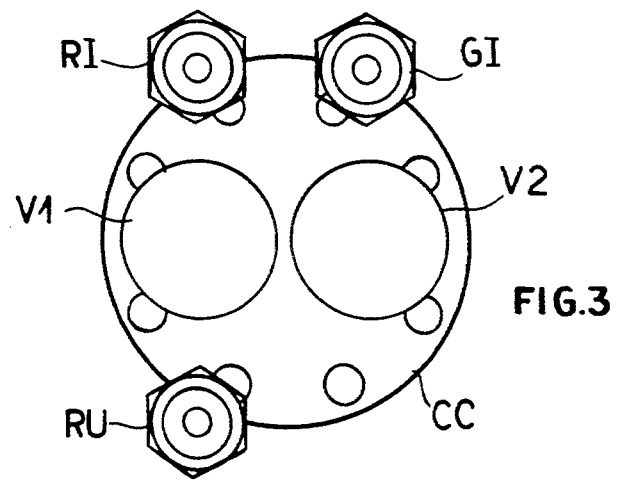
FIG.1　　FIG.2
FIG.3

1

VAPOUR GENERATOR FOR CHEMICAL VAPOUR DEPOSITION SYSTEMS

BACKGROUND OF THE INVENTION

1. Field of the Invention

The present invention relates to the equipment for the realization of semiconductor devices, and more particularly it concerns a vapour generator for chemical vapour deposition systems.

2. Description of the Prior Art

It is known that many electronic devices, and more particularly many optoelectronic devices used in the optical fiber transmission systems, such as laser, photodetectors, etc., are made up of structures of semiconductor materials comprising different monocrystalline layers with a varying composition and with thicknesses ranging from fractions of a micron to a few microns.

The individual layers are obtained by depositing the suitable compounds on a starting substrate; different methods can be used for the operation, among which the deposition method from vapour-phase reagents, called MOCVD (Metal-Organic Chemical Vapour Deposition), is rather widely used.

According to this method the possible sources of metals and of non-metals are some metalorganic compounds and pure elements, such as mercury.

During deposition, with the help of carrier gases such as, $H_2$, Ar, vapours of these reagents are transported into the reactor where the starting substrate is contained, and kept at a suitable temperature. Here they react with one another and give origin to the required semiconductor material which deposits on the substrate. To obtain different layers the flow of reagents of a certain composition is replaced with the flow of reagents of a different composition, trying, at the same time, to keep all the other physical conditions unchanged, to avoid the formation of layers whose composition is not controlled.

The composition of the individual layers depends on the quantity of vapours reacting inside the reactor and therefore on the quantity of vapours which are extracted from the relevant sources and led to the reactor. Extraction of vapours is performed in special generators called bubblers if the source is a liquid, or sublimators if the source is solid. Extraction efficiency depends on different factors, the main of which are the carrier gas flow running the vapour generator in which the source is contained, the temperature and the pressure at which the source itself is kept.

One of the problems arising in transporting vapours from the generator to the reactor is their condensation on the internal surface of the ducts, specially if they are kept at room temperature. There are no drawbacks when the required quantity of vapours is very high, and the source temperature in the generator can therefore be kept at temperature values which are lower than room temperature. As a matter of fact, the mixture of the carrier gas saturated with source vapours goes out from the generator and is let into the ducts with a higher temperature, where it is heated and it becomes unsaturated enabling it to be led to the reactor without any danger of condensation.

When a greater quantity of vapours is required or reagent vapour pressure is very low, the temperature necessary to produce sufficient quantities of vapours must be higher than that of room temperature. In this case condensation can be avoided by heating the ducts at the output of the vapour generator so as to bring them, at least to the first dilution point, to a temperature which is higher than that of the container.

The dilution with inert gas of the saturated mixture of the reagent makes the mixture unsaturated and its condensation temperature becomes therefore lower. When using the generators available on the market, such as those manufactured by the Morton International Company (U.S. Pat. No. 4,506,815), the mixture is normally diluted at the output of the container after running a section of the system line, comprising certain components such as valves, pipes, fittings, etc.

This section of the line must be provided with a heating system assuring a constant and controlled temperature to avoid both condensation, and vapour decomposition at too high temperatures. Obviously a system like this involves a remarkable complication during the construction stage of the system.

SUMMARY OF THE INVENTION

The vapour generator, provided by the present invention, obviates these drawbacks since it does not require the use of further heating systems by permitting the dilution of the mixture of carrier gas and reagent vapour directly inside it without any condensation problems and which can behave both as a bubbler for liquid regents and as a sublimator for solid reagents.

It is an object of the present invention a vapour generator for chemical deposition systems.

BRIEF DESCRIPTION OF THE DRAWINGS

The foregoing and other characteristics of the present invention will be made clearer by the following description of a preferred embodiment thereof, given by way of a non limiting example, and by the annexed drawings, wherein:

FIG. 1 is a first longitudinal section of the vapour generator;

FIG. 2 is a second longitudinal section of the vapour generator, carried out with a plane perpendicular to that in FIG. 1;

FIG. 3 is a top view of the vapour generator.

DESCRIPTION OF THE PREFERRED EMBODIMENTS

The vapour generator, shown in FIG. 1, mainly consists of an airtight cylindrical container CC, into which the reagent liquid or solid vapour source SO is deposited. In the container upper base there are two holes IN and OU, communicating from one side with the inside of the vapour generator, hole OU being extended with a section of pipe TU till almost the lower base of the container, and on the other side holes IN and OU communicate respectively with two pneumatic driven valves V2 and V1. Valve V2 is connected with a pipe section TG, obtained within the body of the upper base, while valve V1 is connected to a bypass-line LP, which is also obtained within the upper base. When the valves are idle, the container is hermetically sealed and when they are operating, vapours and gases enter and go out through holes IN and OU.

In FIG. 2 bypass-line LP can be seen better, provided respectively with input and output unions RI and RU.

In FIG. 3 union GI can be seen, connected to pipe section TG.

The whole vapour generator is immersed in a thermostatic bath, not shown in the figures, which keeps it at the temperature necessary to obtain at its inside the required vapour pressure.

During operation, valves V1 and V2 are open and so the dry carrier gas enters into the vapour generator through union GI, pipe section TG, valve V2 and hole IN, it is saturated with the vapours emitted by source SO and goes out through pipe section TU, hole OU, valve V1 and bypass-line LP.

Bypass-line is continuously run by a carrier gas flow, independently from the state of valve V1. This flow enters through union RI, reaches valve V1, where it mixes with the saturated gas coming from the inside of the generator through hole OU and gives origin to an unsaturated mixture going out through union RU to be led to the reactor.

The junction point of the bypass-line LP with hole OU, when valve V1 is open, constitutes the dilution point of mixture saturated with reagent. Since the duct section made up of hole OU and line LP is realized in the generator wall itself, which is made of metal, its temperature is the same as that of the generator, which is conditioned by the thermostatic bath, so that reagent condensation may not take place. After the bypass-line, the mixture is remarkably diluted, therefore its condensation temperature diminishes in proportion and condensation may not take place.

To have this condensation temperature lower than room temperature, it will be sufficient to set a carrier gas flow in the bypass-line with a value enabling to obtain the suitable dilution percentage in relation to the difference of temperature between generator and lines, which are generally held at room temperature.

A vapour source can e.g. be trimethylindium, melting at 88° C. For extracting a quantity of trimethylindium which can be used in deposition of semiconductors belonging to groups III and V of the Table of elements, it must normally be kept inside the vapour generator at a temperature of 30°–40° C. Its condensation in the pipe system, held at a room temperature of 20° C., can be avoided by having the flow in the bypass-line LP equal to at least 4 or 5 times the flow of the dry gas which is let into the generator through union GI.

It is clear that what described has been given by way of a non limiting example. Variations and modifications are possible without going out of the scope of the claims. Generator, for example may have a shape different from cylindrical.

I claim:

1. Vapour generator for chemical vapour deposition plants, where a carrier gas is saturated with vapours extracted from a source of the reagent in liquid or solid state and is brought to a reaction chamber, comprising an air-tight container (CC) into which a reagent source (SO) can be deposited, possessing a first wall which comprises a first and a second hole (OU, IN), which communicate on one side with the inside of the vapour generator and on the other side respectively with a first and a second pneumatic operated valve (V1, V2), the second valve (V2) being linked to a pipe section (TG), obtained in the body of the said first wall, ending outside into a first union (GI), and the first valve (V1) being linked to a bypass-line (LP), also obtained in the body of the said first wall wherein bypass-line (LP) is connected to a second input union and a third output union (RI, RU).

2. Vapour generator for chemical vapour deposition plants according to claim 1, wherein the first hole (OU) is extended with a section of pipe (TU) till almost the wall opposite the said first wall.

3. Vapour generator for chemical vapour deposition plants according to claim 1, wherein the chemical vapour deposition plants have a cylindrical shape and that the said first wall coincides with the upper base.

* * * * *